US012658563B2

(12) United States Patent
Goli

(10) Patent No.: US 12,658,563 B2
(45) Date of Patent: Jun. 16, 2026

(54) APPARATUS FOR EXTERIOR ELECTRICAL EXTENSION AND SUPPLY OF INTERNET SYSTEM TO CONNECTED DEVICES

(71) Applicant: Ghonche Goli, Reseda, CA (US)

(72) Inventor: Ghonche Goli, Reseda, CA (US)

( * ) Notice: Subject to any disclaimer, the term of this patent is extended or adjusted under 35 U.S.C. 154(b) by 25 days.

(21) Appl. No.: 18/808,374

(22) Filed: Aug. 19, 2024

(65) Prior Publication Data

US 2025/0070452 A1 Feb. 27, 2025

Related U.S. Application Data

(60) Provisional application No. 63/520,905, filed on Aug. 21, 2023.

(51) Int. Cl.
*H01Q 1/22* (2006.01)
*H01Q 1/02* (2006.01)
(Continued)

(52) U.S. Cl.
CPC ............. *H01Q 1/2291* (2013.01); *H01Q 1/44* (2013.01); *H04B 7/15507* (2013.01); *H04W 84/12* (2013.01); *H04W 88/08* (2013.01); *H01Q 1/02* (2013.01); *H05K 5/0213* (2013.01); *H05K 5/0247* (2013.01)

(58) Field of Classification Search
CPC .... H01Q 1/2291; H01Q 1/44; H04B 7/15507; H04W 84/12; H04W 88/08
See application file for complete search history.

(56) References Cited

U.S. PATENT DOCUMENTS 9,172,199 B2 * 10/2015 Birdwell .............. H01R 13/652
9,784,417 B1 * 10/2017 Springer ................. F21K 9/232
(Continued)

FOREIGN PATENT DOCUMENTS

IT 202000025213 A1 * 4/2022 ........... H05B 47/185

OTHER PUBLICATIONS

Ehaho Porch Lights with Outlet, Dusk to Dawn Outdoor Light with Built-in GFCI Outlet, Waterproof Anti-Rust Lantern for Front Door (White 1 PC)—Amazon.com; May 4, 2023; https://www.amazon.com/Ehaho-Outdoor-Waterproof-Anti-Rust-Lantern/dp/B0C49NC8GS?th=1 (Year: 2023).*

(Continued)

*Primary Examiner* — Ab Salam Alkassim, Jr.
(74) *Attorney, Agent, or Firm* — Patent 360; Barry Choobin

(57) ABSTRACT

An apparatus for outdoor power supply and internet connectivity that can be mounted to an exterior porch light junction box or independently, receiving alternate power through a grounded interior property outlet. The apparatus includes a housing having a front side and a rear side, wherein the rear side is mounted to the junction box or affixed to an exterior substrate. One or more transformers are encased within the housing for transforming the power supply, such as from 110 V to 24 V. A Wi-Fi extender is encased within the housing, wherein hybrid antennas of the Wi-Fi extender and/or LTE and 5G internet are mounted to an outer side of a wall of the housing. A porch light or other apparatus may be mounted to the front side of the housing. Multiple power sockets are connected to the power supply and the transformer, respectively.

13 Claims, 3 Drawing Sheets

(51) Int. Cl.

| | |
|---|---|
| *H01Q 1/44* | (2006.01) |
| *H04B 7/155* | (2006.01) |
| *H04W 84/12* | (2009.01) |
| *H04W 88/08* | (2009.01) |
| *H05K 5/02* | (2006.01) |

(56) References Cited

U.S. PATENT DOCUMENTS

| | | | | |
|---|---|---|---|---|
| 10,326,921 | B2 * | 6/2019 | Chien | H04N 7/183 |
| 10,520,177 | B2 * | 12/2019 | Bailey | F21S 8/033 |
| D887,060 | S * | 6/2020 | Wang | D26/63 |
| 10,827,574 | B1 * | 11/2020 | Fu | F21S 8/033 |
| 10,887,958 | B1 * | 1/2021 | Fu | H05B 47/13 |
| 10,986,719 | B2 * | 4/2021 | Hartung | H04B 7/15507 |
| 11,258,932 | B1 * | 2/2022 | Tylicki | H02G 3/16 |
| 11,304,274 | B1 * | 4/2022 | Fu | H04N 7/183 |

| | | | | |
|---|---|---|---|---|
| 2003/0210340 | A1 * | 11/2003 | Frederick Romanowich | G08B 13/1966 |
| | | | | 348/E5.029 |
| 2015/0351096 | A1 * | 12/2015 | Sidhu | H04W 72/0453 |
| | | | | 370/329 |
| 2018/0013271 | A1 * | 1/2018 | Goulden | H02G 3/04 |
| 2018/0249054 | A1 * | 8/2018 | Chien | F21V 23/0464 |
| 2018/0332204 | A1 * | 11/2018 | Chien | H04N 7/186 |
| 2019/0215936 | A1 * | 7/2019 | Hartung | H04B 7/15507 |
| 2019/0253670 | A1 * | 8/2019 | Chien | F21S 4/28 |
| 2019/0347916 | A1 * | 11/2019 | Wild | H04L 67/1095 |

OTHER PUBLICATIONS

AKK Smart Porch Light with Outlet, APP Control Outdoor Wall Lights, Color Changing RGBCW Outdoor Light Fixture, Work with Alexa (Required Gateway), Outdoor Lights for House—Amazon. com; Jul. 25, 2023; https://www.amazon.com/AKK-Control-Changing-Required-Waterproof/dp/B0CCRYY75D (Year: 2023).*

* cited by examiner

APPARATUS FOR EXTERIOR ELECTRICAL EXTENSION AND SUPPLY OF INTERNET SYSTEM TO CONNECTED DEVICES

CROSS-REFERENCE TO RELATED APPLICATIONS

This application claims priority from a U.S. Provisional Patent Appl. No. 63/520,905, filed on Aug. 21, 2023, which is incorporated herein by reference in its entirety.

FIELD OF INVENTION

The present invention relates to converting an electrical source of an exterior porch light junction box into supporting and powering an apparatus to provide exterior and interior Power, a Wi-Fi Extender, and up to five different types of Internet Source Connectivity to multiple exterior and interior electrical and smart IoT devices.

BACKGROUND

Outdoor power supply is uncommon in most households and commercial buildings. People do not have outdoor power sockets for a variety of reasons. However, advances in technology are changing daily lives, with a huge number of electronic goods made available to ease life, improve lifestyles, enhance security, and provide entertainment. Many electronic goods are available for outdoor use.

Many electronic devices for outdoor use typically are powered by batteries because most of the buildings lack an external power supply. The use of batteries, however, has major limitations and a negative carbon footprint. Some devices need a continuous power supply which can only be possible through a hardwire connection with the main power supply of the building. Also, the manufacture, use, and disposal of batteries have a bad impact on the environment. A huge number of batteries are being dumped daily throughout the world. The world has discovered the battery-operated devices that were first developed and sold have become the antithesis of what is truly desired.

The number of outdoor electronic products and thus power demand is increasing at a fast rate. For example, outdoor cameras and video doorbells are becoming common for security and comfort.

The evolution of NG911 EMS and the need for GPS and other technology-based connectivity products, e-commerce delivery that has similar needs and resulting in the adoption of automated mapping, notifications, security, and delivery package handling systems, continue to drive the requirement of viable internet and power.

Internet is a requirement both indoors and outdoors, many desire outdoor Wi-Fi coverage. IoT devices are also getting quite popular, enhancing lives by giving people more control and peace of mind.

Thus, outdoor power supply has become a necessity in most buildings. Extending an internal power supply outdoors is a laborious task and requires many modifications in the building. The wires may also be unpleasing in view and usually, professional help is needed. Hiring an electrician to run sufficient electrical power, which can include both 110 V and 24 V, can cost hundreds of dollars and create a barrier that many people choose not to deal with.

A need is therefore appreciated for an outdoor power hub that can power multiple devices without the limitations and drawbacks of extending a hardwire line. A simple and effective solution is needed to include the over one hundred million rental units (in the U.S. alone), and leaseholds such as commercial businesses, which suffer due to their inability to make permanent property modifications as may otherwise be necessary.

SUMMARY OF THE INVENTION

The following presents a simplified summary of one or more embodiments of the present invention to provide a basic understanding of such embodiments. This summary is not an extensive overview of all contemplated embodiments and is intended to neither identify key or critical elements of all embodiments nor delineate the scope of any or all embodiments. Its sole purpose is to present some concepts of one or more embodiments in a simplified form as a prelude to the more detailed description that is presented later.

The principal object of the present invention is therefore directed to an outdoor power hub that can power multiple devices without requiring any modifications in the building.

Another object of the present invention is that the apparatus is economical to manufacture, install, and use.

Still, another object of the present invention is that the apparatus has multiple utilities.

Yet another object of the present invention is that the apparatus can be installed on an exterior porch light junction box.

A further object of the present invention is that the apparatus can extend Wi-Fi coverage to outdoors.

Still, a further object of the present invention is the apparatus that includes powering an affixed light fixture.

An additional object of the present invention is the apparatus that can eliminate the need for battery-powered devices.

Still, an additional object of the present invention is that the apparatus has an aesthetic appearance.

In one aspect, disclosed is an apparatus that can use an electrical source of an exterior porch light junction box for exterior and interior Power, use as a Wi-Fi Extender, and connect up to four different types of Internet Source Connectivity to multiple exterior and interior electrical and smart IoT devices.

In one aspect, disclosed is an apparatus that can also be plugged into an interior electrical outlet in case no exterior junction box exists, by drilling an access hole in an exterior wall, to place the apparatus in a position to be connected to specific lighting, safety, and security devices desired for use in residential and commercial properties.

In one aspect, the apparatus may allow connectivity of up to four different Internet Sources, from Cellular based Internet, hardwired Ethernet, Satellite Internet, and Fiber-Optic Internet, are possible through specifically designed exterior connectivity ports that allow for each Internet Source Provider.

In one aspect, the disclosed apparatus provides hardwired electrical, Internet, and Wi-Fi connectivity to a variety of electronic components and eliminates the use of battery-operated devices.

In one aspect, disclosed is an apparatus for outdoor power supply and internet connectivity, the apparatus comprising a housing having a front side and a rear side, wherein the rear side is mounted to the junction box, the rear side has a hole for receiving wires from the junction box for a main power supply; one or more transformers encased within the housing for transforming the main power supply; and a Wi-Fi extender encased within the housing, wherein antennas of the Wi-Fi extender are mounted to an outer side of a wall of the housing. The apparatus further comprises a porch-style light fixture mounted to the front side of the housing. The apparatus further comprises one or more power sockets configured in the wall of the housing.

In one aspect, the one or more power sockets comprise two to four power sockets, wherein one of the two to four power sockets is connected to the main power supply, and a second power socket of the two to four power sockets is connected to one of the one or more transformers.

In one aspect, the transformer is configured to transform a 110 V power supply to a 24V power supply.

In one aspect, the housing has venting slots configured in the wall for dissipating heat.

In one aspect, the apparatus further comprises a light sensor; a motion sensor; and a switch connected to the light sensor and the motion sensor for switching between the light sensor and the motion sensor. The light sensor and the motion sensor are mounted in a sensor casing, wherein the sensor casing is mounted to the housing through a shaft and a rotatable joint.

In one aspect, the apparatus further comprises a mesh Wi-Fi Repeater.

In one aspect, disclosed is a method for outdoor power supply and internet connectivity, the method comprising removing an exterior porch light from a junction box; and mounting an apparatus over the junction box. The apparatus comprises a housing having a front side and a rear side, wherein the rear side is mounted to the junction box, the rear side has a hole for receiving wires from the junction box for a main power supply, one or more transformers encased within the housing for transforming the main power supply, and a Wi-Fi extender encased within the housing, wherein antennas of the Wi-Fi extender are mounted to an outer side of a wall of the housing.

In one aspect, the apparatus further comprises four separate 1.0 Gigabit and one 2.5 Gigabit Ethernet port positioned on a top of the housing for LTE and 5G external internet source connectivity; hybrid 5 GHz and 2.4 GHz spectrum hybrid antennas; an integrated Cellular Module internet source connected to the hybrid 5 GHz and 2.4 GHz spectrum hybrid antennas; a Fiber-Optic internet female plug; and a Satellite internet female plug.

BRIEF DESCRIPTION OF DRAWINGS

The accompanying figures, which are incorporated herein, form part of the specification and illustrate embodiments of the present invention. Together with the description, the figures further explain the principles of the present invention and to enable a person skilled in the relevant arts to make and use the invention.

DETAILED DESCRIPTION

Figure 1:
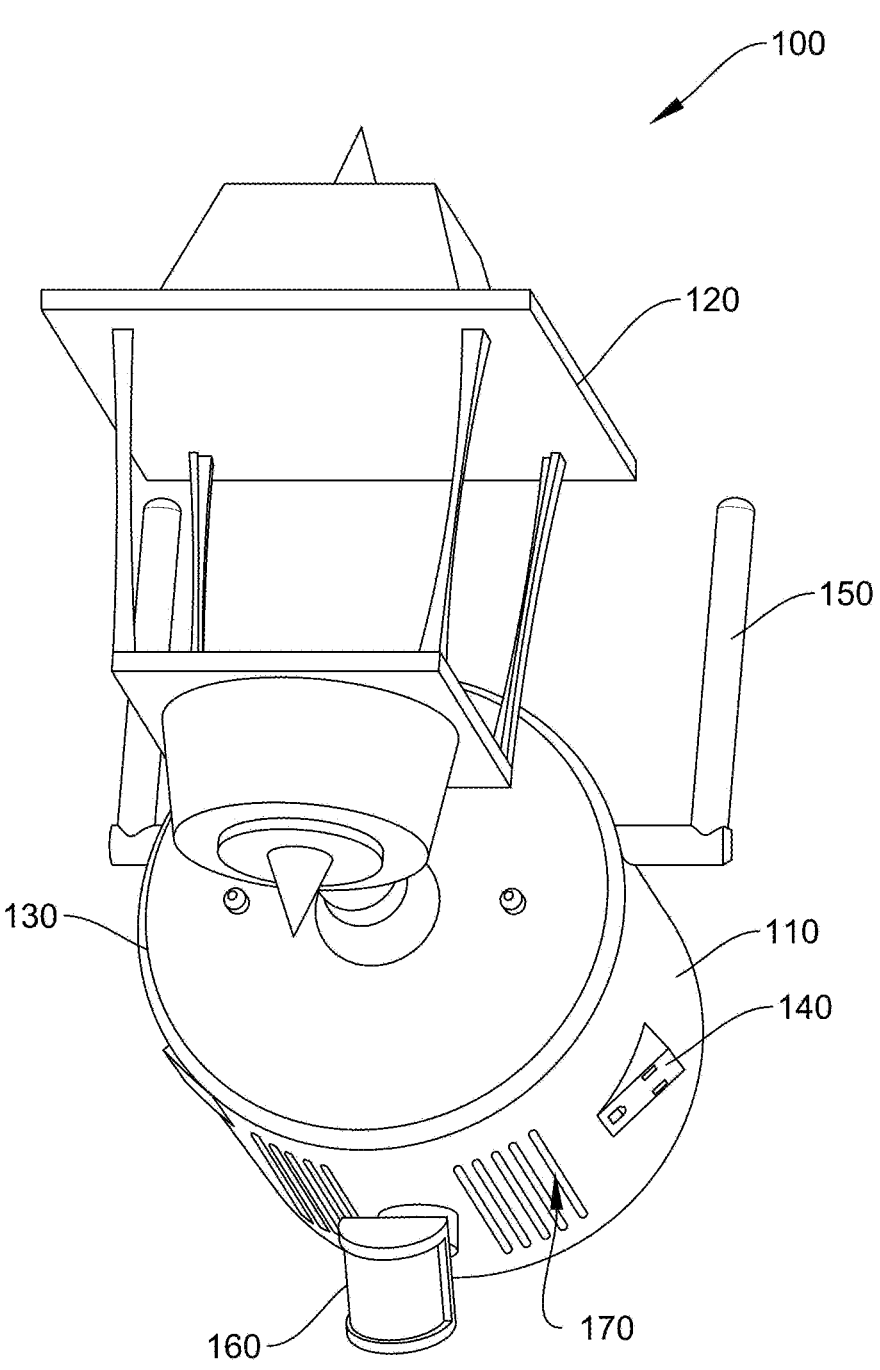
FIG. 1 is a perspective view of the apparatus with a light fixture, according to an exemplary embodiment of the present invention.

Subject matter will now be described more fully hereinafter with reference to the accompanying drawings, which form a part hereof, and which show, by way of illustration, specific exemplary embodiments. Subject matter may, however, be embodied in a variety of different forms and, therefore, covered or claimed subject matter is intended to be construed as not being limited to any exemplary embodiments set forth herein; exemplary embodiments are provided merely to be illustrative likewise, a reasonably broad scope for claimed or covered subject matter is intended. Among other things, for example, the subject matter may be embodied as methods, devices, components, or systems. The following detailed description is, therefore, not intended to be taken in a limiting sense.

The word "exemplary" is used herein to mean "serving as an example, instance, or illustration." Any embodiment described herein as "exemplary" is not necessarily to be construed as preferred or advantageous over other embodiments. Likewise, the term "embodiments of the present invention" does not require that all embodiments of the invention include the discussed feature, advantage or mode of operation.

The terminology used herein is for the purpose of describing particular embodiments only and is not intended to be limiting of embodiments of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

The following detailed description includes the best currently contemplated mode or modes of carrying out exemplary embodiments of the invention. The description is not to be taken in a limiting sense but is made merely to illustrate the general principles of the invention since the scope of the invention will be best defined by the allowed claims of any resulting patent.

The described invention pertains to an apparatus for outdoor use that includes a power hub for powering multiple outdoor electronic devices. The apparatus can also include a porch-style light fixture. The apparatus also includes a Wi-Fi extender for providing outdoor Wi-Fi coverage. The apparatus can be mounted to a wall of a building, and the building could be a residential building, commercial building, public building, and the like. The apparatus can be powered by the main power supply of the building and hardwired to the main power supply. For example, the apparatus can be installed at an electric junction box for a porch light. The apparatus can be installed at any power junction or switch available outdoors and provides a range of options for connecting different electrical devices including IoT devices. The apparatus when installed has an aesthetic appearance without any clutter of wires. The apparatus eliminates the need for extending hardwires through spaces in doors, windows, and the like which are unsafe due to pinching or cutting the electrical cord through the operation of the door, which in turn exposes the people to electrical shock or a short in the electrical system of the property.

The apparatus addresses and solves the problems in powering outdoor electronic devices and providing direct PoE (power over Ethernet), and Wi-Fi connectivity, allowing for the direct hardwire powering of a wide array of electronics to be utilized without the need for battery-operated devices. The disclosed apparatus can provide an available power and internet source with the required voltage and amperage to sufficiently power a suite of integrated electronic devices and technologies and thus become a gateway and platform to provide many desired and necessary features and benefits to make people's lives safer, more convenient, and more secure.

Disclosed is an electrical and internet junction box extension apparatus that supports a porch-style exterior light and a variety of other electrical and internet source electronic devices and methods for powering such devices, including support for smart IoT devices.

The electrical apparatus can be powered directly by a power supply of the building. The apparatus can be connected through suitable connectors. The building can be a residential unit or a commercial unit. Thus, the disclosed electrical apparatus can be easily installed, such as using a plug-and-play connection and different connectivity options.

In certain implementations, the apparatus can include a standard-size cylindered, square, or rectangular extension housing that covers the existing junction box in the wall or ceiling, which simulates the size of an atypical residential or commercial junction box that supports and provides hardwired power to an exterior or interior light, is utilized. The use of an extension cord is not possible in these situations to provide outdoor power as there is no safe way to transition through a door or window with the required clearance and space while avoiding pinching or cutting the electrical cord through the operation of the door and being exposed to electrical shock or a short in the electrical system of the property, or exposing the safety and security of the property and occupants with an unlocked window.

Figure 3:
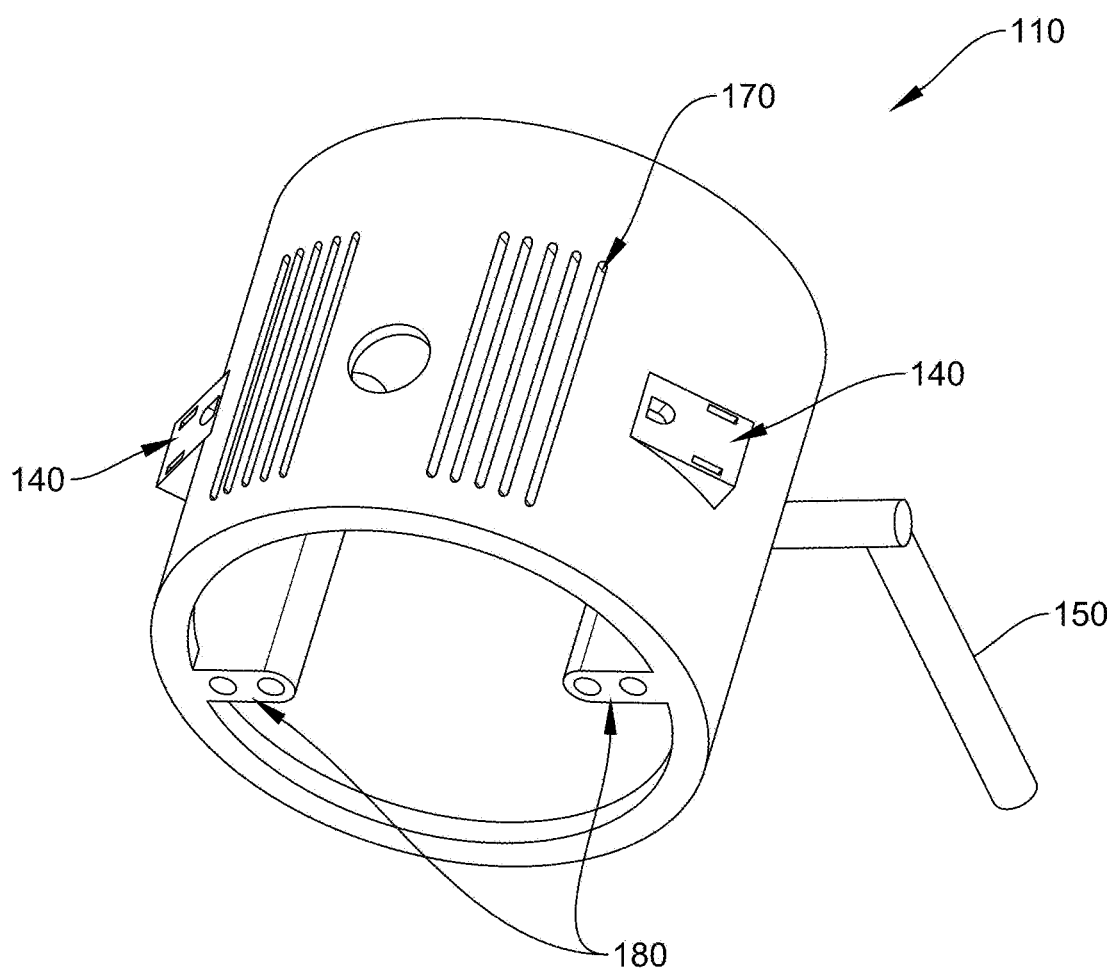
FIG. 3 shows the housing of the apparatus, according to an exemplary embodiment of the present invention.

Referring to FIG. 1 which shows a perspective view of apparatus 100. Apparatus 100 includes a housing 110 that encases different components of the apparatus. The housing shown in FIG. 1 is of a cylindrical hollow profile that has a front side and a rear side. The housing 110 is more clearly shown in FIG. 3. The apparatus 100 can be mounted to a supporting structure, such as a wall at the rear side of the housing. The rear side of the housing may include a flange with holes for the screws to pass through. The screws can be used to secure the housing to the supporting structure. The rear side can also have at least a hole for wires to pass through. FIG. 3 shows a hollow rear end of the housing; however, the rear side can be provided with a plate to cover the open end of the housing. The plate and any holes in the plate for wires can be sealed to prevent any ingress of moisture, dust, insects, and the like into the housing. Also, it is to be noted that the housing is shown as a cylindrical shape, however, the shape can be varied without departing from the scope of the present invention. For example, the housing can be of a polygonal, rectangular, or square shape.

On the front side of the housing can be mounted a light fixture, such as a porch light 120. The disclosed apparatus can replace an existing porch light on the outdoor wall. Plate 130 of the porch light can cover the open front end of the housing. It is to be noted that all the openings and ports in the housing can be sealed to prevent ingress of water. For example, the rear side of the housing can have a peripheral flange that can receive a foam-style weather gasket to seal out water seepage or intrusion and conform to various exterior wall materials, such as stucco, siding, masonry, brick, etc. Similarly, the front side of the housing can also be sealed using a gasket. The housing can include a flange 180 for connecting the porch light. This flange 180 can extend along the length of the housing.

The apparatus may include a connector that can connect to electrical wires from a junction box of the building, for example, the junction box of a porch light. The connector can have attachments for three wires including the live, neutral, and ground. The apparatus may also include a power conditioning unit that can transform and condition the input power from the building's main power supply. The power conditioning unit can include one or more transformers for converting an input voltage to one or more output voltages. The power conditioning unit can also allow for AC to DC power conversion. The power conditioning unit can also protect against spikes and surges that may otherwise damage the electrical circuits. For example, the power conditioning unit can include a 24 V transformer.

The device can have simple connectivity wires that receive their hardwired power from the property's junction box with a neutral, positive, and ground, and be part of the pre-wired circuitry that powers the built-in 24 V Transformer, and then sends the transformed power to a port of the apparatus connected to a built-in female connector plug unique for the 24 V power supply. The output from the 24 V power supply can be used to power 24 V electronic devices.

Again, referring to FIG. 1, the apparatus includes power sockets 140 for connecting to electronic devices. Multiple power sockets can be provided for multiple electronic devices. These sockets can be configured in the wall of the housing. Different types of sockets can be provided for different voltages. For example, one or more 24 V sockets get power from the 24 V transformer. Similarly, 110 V power sockets for powering 110 V electronic devices can be included. Similarly, 12 V power sockets for powering 12 V electronic devices can also be included.

Figure 2:
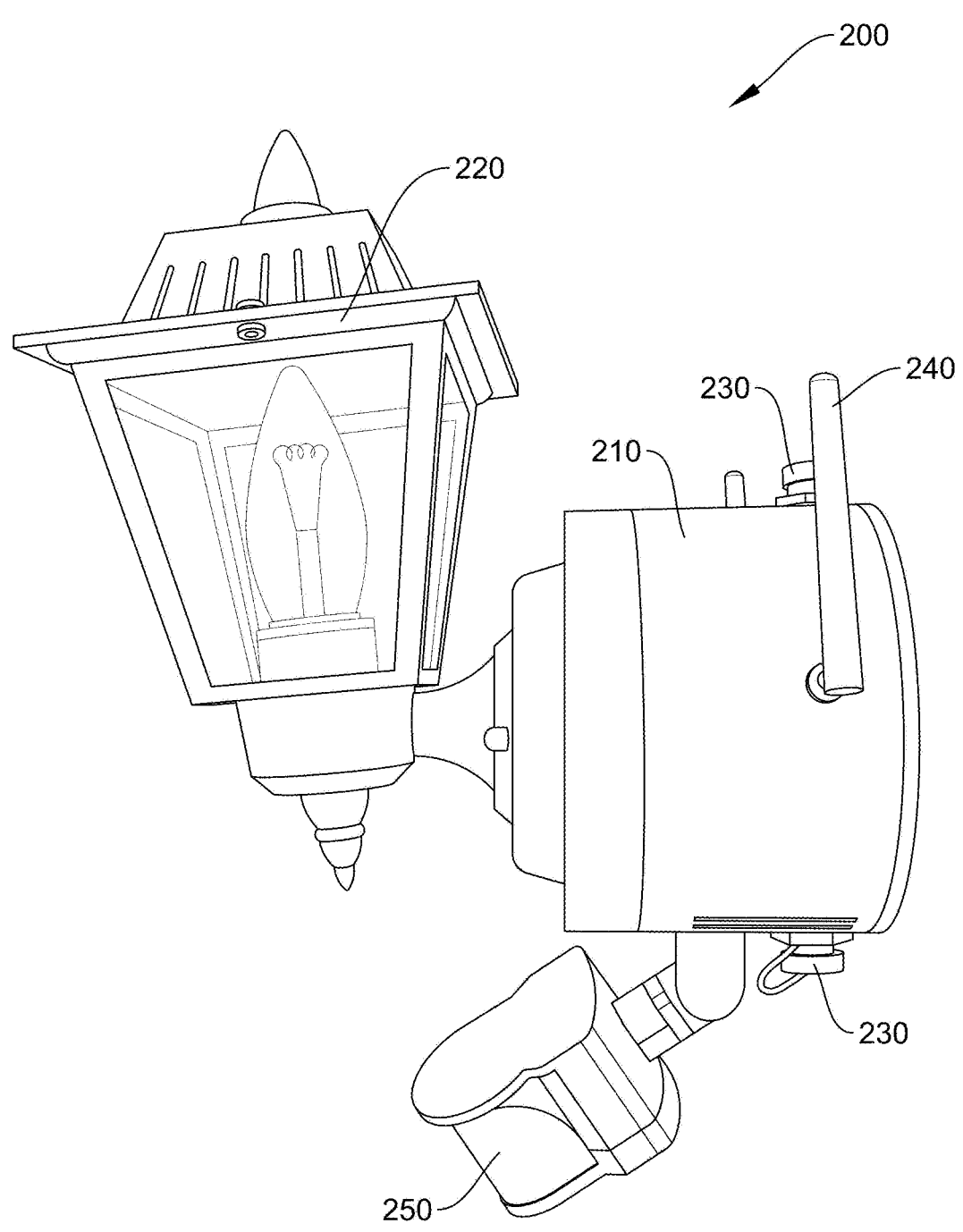
FIG. 2 shows the apparatus with different power sockets, according to an exemplary embodiment of the present invention.

This information about the voltage can be written adjacent to respective sockets as labels or warnings. Also, to avoid any mix-up, the sockets may only receive compatible plugs. For example, a 24 V power socket can be designed to receive a specific type of plug that cannot be inserted into a 110 V power socket. This prevents any accidental mix-up of the power supply. Also, the socket and plugs can be made waterproof for outdoor use, as shown in FIG. 2. Color coding can also be used for sockets and plugs to avoid a mismatch. For heat dissipation, venting slots 170 for the integrated 24 V transformer can be designed into the sides of the housing near the primary wiring port.

FIG. 2 shows the apparatus 200 with different power sockets 230. Apparatus 200 includes a housing 210 that encases different components of the apparatus. On the front side of the housing can be mounted a light fixture, such as a porch light 220. The apparatus may also include a suitable number of antennas 240 coupled to housing. FIG. 2 also shows sensors 250 mounted to the bottom of the housing.

The sockets can also be covered for protection against weather when not in use. The covers can be attached to the housing through suitable lanyards. The 110 V socket can be protected by a GFI exterior-rated breaker with reset switches mounted on the face of the apparatus. A cover plate can screw in as the port cover with round access holes for the extension cords and securely hold the male connectors in place to avoid accidental or intentional disconnection.

The apparatus may also include network circuitry for creating suitable networks for connectivity. The network circuitry can also extend the coverage of existing networks, such as Wi-Fi coverage can be extended outdoors. In certain implementations, the apparatus may include a cellular module that can receive input from indoors. The apparatus may also include a suitable number of antennas 150 coupled to housing. FIG. 1 shows two antennas at two opposite sides of the housing. Other examples of the networks include RS232 Ethernet, Satellite Internet, and Fiber-Optic Internet. Standard female receptors are designed for each particular Internet Source into the top elevation of the housing into a molded-in extension that allows for the external and internal connectivity to receive the Source and transfer it via a 90° angle through a specified cable (Fiber-Optic/PoE) through the wall and encased in Graphene Romex (to protect from fire and water) to the interior connections. Sufficient space for Connectivity at the Top of the housing by Installers is important as part of the design so they would have an easy time "plugging in" their specific Internet Source Service.

A properly sized Cord Cover (with Alien-type tape backing and small screw holes) extending from the connectivity point up the Exterior Wall can keep the Internet Source cables neat, secure, and tidy, while a "Rubber Boot" that connects at the bottom of the Cord Cover and extends overall (four potential) Internet Supply Cables at the top elevation of the housing and protects them from water intrusion, ice, dust, insects, etc., is necessary and will make for a clean completed installation.

The disclosed apparatus may also include suitable sensors to automate the operation of the light. For example, the sensor may be a light sensor that can detect dawn and dusk. The sensor can also be a motion sensor that can detect motion near the apparatus and turn on the light for a predefined duration. More than one sensor type can be used with the user having an option to select the sensor type. A switch can be provided for selecting between two sensor types. The light can be operated by the selected sensor. FIG. 1 shows sensors 160 mounted to the bottom of the housing through a shaft and a rotatable joint that allows adjusting the position of the sensors. The sensors can be encased within a sensor casing that may be weatherproof and waterproof.

The apparatus can be manufactured in a range of colors and designs, for aesthetic appearance wherein the users can choose the desired one.

In certain implementations, a Mesh Wi-Fi Repeater is integrated into the apparatus for extending Wi-Fi coverage outdoors. An external camera can also be mounted to the housing, wherein the camera may support Live Shooter Technology, and machine learning-assisted trekking of objects. The camera can be plugged directly into any side power port utilizing the proprietary 5-pin power plug, creating a weather-tight seal and secured via two security screws.

In certain implementations, the apparatus may include a proprietary five-pin connector and a matching plug for both 24 V and 110 V electrical power, with either or both being the supplied power source, utilized to plug into one of four separate power ports around the sides of the apparatus that automatically forms a weather-tight seal once the side cover is removed and the male plug is inserted as a plug and play power concept that can provide exterior power to a wide variety of electrical devices and smart IoT components.

The male plug with the extension cord is either the matching pins to connect to the female connectors 24 V power, 110 V power, or both and labeled as such in a unique way to identify which power the said plug and extension cord produces. Specifically designed components and smart IoT devices can be modified to receive the same 5-pin connecting plugs and connectors to receive the said power sources.

While the foregoing written description of the invention enables one of ordinary skill to make and use what is considered presently to be the best mode thereof, those of ordinary skill will understand and appreciate the existence of variations, combinations, and equivalents of the specific embodiment, method, and examples herein. The invention should therefore not be limited by the above-described embodiment, method, and examples, but by all embodiments and methods within the scope and spirit of the invention as claimed.

What is claimed is:

1. An apparatus for outdoor power supply and internet connectivity, the apparatus comprising:
a housing having a front side and a rear side, wherein the rear side is mounted to a junction box, the rear side has a hole for receiving wires from the junction box for a main power supply;
one or more transformers encased within the housing for transforming the main power supply; and
a Wi-Fi extender encased within the housing, wherein antennas of the Wi-Fi extender are mounted to an outer side of a wall of the housing;
a porch-style light fixture mounted to the front side of the housing;
two or more power sockets configured in the wall of the housing;
wherein one power socket is connected to the main power supply and a second power socket is connected to one of the one or more transformers;
wherein the transformer is configured to transform a 110 V power supply to a 24V power supply.

2. The apparatus of claim 1, wherein the two or more power sockets comprise two to four power sockets.

3. The apparatus of claim 1, wherein the housing has venting slots configured in the wall for dissipating heat.

4. The apparatus of claim 1, wherein the apparatus further comprises:
a light sensor;
a motion sensor; and
a switch connected to the light sensor and the motion sensor for switching between the light sensor and the motion sensor.

5. The apparatus of claim 4, wherein the light sensor and the motion sensor are mounted in a sensor casing, wherein the sensor casing is mounted to the housing through a shaft and a rotatable joint.

6. The apparatus of claim 1, wherein the apparatus further comprises:
a mesh Wi-Fi Repeater.

7. A method for outdoor power supply and internet connectivity, the method comprising:
removing an exterior porch light from a junction box; and
mounting an apparatus over the junction box, wherein the apparatus comprises:
a housing having a front side and a rear side, wherein the rear side is mounted to the junction box, the rear side has a hole for receiving wires from the junction box for a main power supply,
one or more transformers encased within the housing for transforming the main power supply, and
a Wi-Fi extender encased within the housing, wherein antennas of the Wi-Fi extender are mounted to an outer side of a wall of the housing;
two or more power sockets configured in the wall of the housing;
wherein one power socket is connected to the main power supply and a second power socket is connected to one of the one or more transformers;
wherein the transformer is configured to transform a 110 V power supply to a 24V power supply;
mounting a porch-style light fixture to the front side of the housing.

8. The method of claim 7, wherein the method further comprises:

connecting a plug in a power socket of the one or more power sockets.

9. The method of claim 8, wherein the two or more power sockets comprise two to four power sockets.

10. The method of claim 7, wherein the housing has venting slots configured in the wall for dissipating heat.

11. The method of claim 7, wherein the apparatus further comprises:

a light sensor;

a motion sensor; and a switch connected to the light sensor and the motion sensor for switching between the light sensor and the motion sensor.

12. The method of claim 11, wherein the light sensor and the motion sensor are mounted in a sensor casing, wherein the sensor casing is mounted to the housing through a shaft and a rotatable joint.

13. The method of claim 7, wherein the apparatus further comprises:

a mesh Wi-Fi Repeater.

* * * * *